United States Patent
Kiri et al.

(10) Patent No.: US 11,554,384 B2
(45) Date of Patent: Jan. 17, 2023

(54) LIQUID GUIDING BOUNDARIES FOR POROUS SUBSTRATES PROVIDING INCREASED BIODEGRADABILITY

(71) Applicant: Teknologian tutkimuskeskus VTT Oy, Espoo (FI)

(72) Inventors: Kaisa Kiri, Espoo (FI); Adina Anghelescu-Hakala, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 438 days.

(21) Appl. No.: 16/843,927

(22) Filed: Apr. 9, 2020

(65) Prior Publication Data
US 2020/0324541 A1 Oct. 15, 2020

(30) Foreign Application Priority Data
Apr. 12, 2019 (FI) .................... 20195304

(51) Int. Cl.
| | | |
|---|---|---|
| B05D 5/00 | (2006.01) | |
| B05D 7/24 | (2006.01) | |
| B01L 3/00 | (2006.01) | |
| B41F 15/08 | (2006.01) | |
| B81C 1/00 | (2006.01) | |
| B41M 3/00 | (2006.01) | |
| B41M 1/04 | (2006.01) | |

(52) U.S. Cl.
CPC .......... *B05D 5/00* (2013.01); *B01L 3/502707* (2013.01); *B05D 7/24* (2013.01); *B41F 15/0804* (2013.01); *B41M 3/006* (2013.01); *B81C 1/00119* (2013.01); *B81C 1/00373* (2013.01); *B01L 2200/12* (2013.01); *B01L 2300/126* (2013.01); *B01L 2300/161* (2013.01); *B05D 2203/22* (2013.01); *B41M 1/04* (2013.01); *B41M 2205/34* (2013.01); *B81C 2201/01* (2013.01)

(58) Field of Classification Search
None
See application file for complete search history.

(56) References Cited

U.S. PATENT DOCUMENTS

| | | | |
|---|---|---|---|
| 8,852,526 B2 | 10/2014 | Shen et al. | |
| 2009/0298191 A1* | 12/2009 | Whitesides | G01N 33/523 436/164 |
| 2012/0198684 A1* | 8/2012 | Carrilho | B01L 3/502707 29/527.1 |

(Continued)

FOREIGN PATENT DOCUMENTS

| | | |
|---|---|---|
| CN | 107090087 A | 8/2017 |
| KR | 20160066891 A | 6/2016 |

(Continued)

OTHER PUBLICATIONS

Olkkonen et al: Flexographically printed fluidic structures in paper. Anal. Chem., 2010, vol. 82(24), pp. 10246-10250.

(Continued)

*Primary Examiner* — Michael P. Rodriguez
(74) *Attorney, Agent, or Firm* — Laine IP Oy

(57) ABSTRACT

The present invention relates to a method for manufacturing structural layers for guiding liquid flow on a porous substrate, by printing onto at least one area of at least one surface of the substrate a printing solution containing an aqueous dispersion of a poly(lactic acid)-based copolymer.

16 Claims, 3 Drawing Sheets

(56) References Cited

U.S. PATENT DOCUMENTS

| | | |
|---|---|---|
| 2014/0161974 A1 | 6/2014 | Erho et al. |
| 2016/0207039 A1 | 7/2016 | Vella et al. |

FOREIGN PATENT DOCUMENTS

| | | |
|---|---|---|
| WO | WO2009120963 A2 | 10/2009 |
| WO | WO2010022324 A2 | 2/2010 |
| WO | WO2011073519 A1 | 6/2011 |
| WO | WO2017210606 A1 | 12/2017 |

OTHER PUBLICATIONS

Database WPI: Week 201775. Thomson Scientific, London, GB; AN 2017-59769U, XP002799588, & CN 107 090 087 A (Univ Zhengzhou), Aug. 25, 2017.

* cited by examiner

LIQUID GUIDING BOUNDARIES FOR POROUS SUBSTRATES PROVIDING INCREASED BIODEGRADABILITY

BACKGROUND OF THE INVENTION

Field of the Invention

The present invention concerns a method for manufacturing structural layers guiding a liquid flow on porous substrate sheets, for example by providing hydrophobic structural layers on hydrophilic substrate sheets.

Particularly, the invention concerns the manufacture of such structural layers using polymer dispersions based on poly(lactic acid).

Description of Related Art

In many porous substrates, such as cellulose-based papers, and also porous polymer sheets, liquids travel laterally along the substrate sheet. The flow is generally capillary. Such sheets are exploited in many applications in the field of diagnostics, such as in biosensors and immunoassay-lateral-flows. In these applications it is advantageous to form the substrate sheet in such a way that the sample liquid travels only in specific parts of the sheet, i.e. structural layers guiding the liquid flow are formed in the sheet.

Typically, liquids, which are either hydrophobic themselves, or which can convert the substrate sheet to become hydrophobic in the desired areas, can be applied on the substrate sheet according to a desired pattern, for example by spraying the liquid through a stencil, by silkscreen printing, by inkjet printing, or by using a plotter.

The most common printing methods, such as inkjet printing, in practice, functions as a coating procedure. It is, however, more preferred to provide a procedure, where the printing solution at least partially penetrates into the substrate, thus providing more efficient boundaries for the sample liquid.

Such precise structural layers for guiding the liquid flow can be manufactured in porous substrates using, e.g. the methods described in US 20090298191 A1. The publication discloses, among others, the exposure of the substrate sheet to UV light by using a photoresist to create edges of liquid channels, and the use of a hardening polymer, e.g., polydimethylsiloxane (PDMS), to form a pattern defining the boundary areas of the liquid channels.

Using paper substrates for the above described diagnostics has recently been a hot topic, among others for environmental purposes.

The most commonly used process in forming channels on such paper substrates is wax printing. In wax printing, a wax is heated to sufficiently high temperature for it to be able to permeate into the desired areas of the substrate, and thus causing these areas to become hydrophobic.

For example, US 20120198684 A1 discloses a method for patterning hydrophobic regions onto hydrophilic substrates using a melted wax that permeates the thickness of the substrate and thus defines a pattern on the substrate.

Likewise, WO 2017210606 A1 describes a multi-phase polymer binder used to provide a water barrier coating on at least one surface of a substrate, the binder comprising an aqueous polymer dispersion formed from styrene and methacrylate monomers, and, separately, a hydrophobic emulsion, which typically is a wax emulsion.

However, the use of wax has disadvantages, such as the lack of control in shaping the boundaries, and in providing the boundaries with distinct edges. Therefore, replacements for wax have been investigated, such as the polystyrene-based structures by Olkkonen et al. However, these materials are not biodegradable, and not considered environmentally friendly. Further, the solvents used in the process can be problematic, particularly during upscaling.

SUMMARY OF THE INVENTION

It is an aim of the present invention to provide a new method, which permits a simple and environmental manufacture of structural layers on hydrophilic porous substrates, requiring no organic solvents. For example, these structural layers can be used to create liquid flow channels.

Further, it is an aim of the invention to provide alternative hydrophobic dispersions or solutions, particularly aqueous dispersions of hydrophobic agents, suitable for printing onto hydrophilic substrates, these dispersions containing essentially biodegradable materials.

Preferably, the polymeric materials used in the dispersions of the present invention are selected from suitably sized polymer particles that are capable of penetrating into the pores of the hydrophilic substrate.

Thus, according to a first aspect of the present invention, there is provided a method for manufacturing structural layers guiding a liquid flow on porous substrates.

According to a second aspect of the present invention, there is provided hydrophobic dispersions based on copolymers of poly(lactic acid), suitable for printing onto porous substrates.

The present invention has several advantages over the prior art. Among others, the new process is simple, environmentally friendly, and can be scaled up for use with high volumes. The used process is both cost-effective and fast, and provides precise edges for the liquid channels.

The process is carried out without organic solvents, and the used materials are essentially biodegradable.

The hydrophobic polymer dispersions for use according to the invention also provide modified substrates that have good biodegradability and good barrier properties, with high grease resistance and sufficient oxygen barrier properties.

A further advantage of the invention is that, in terms of printing technology, the present method is compatible with existing printing machines and is thus suitable for mass production.

Additionally, the simple dispersions of the invention are more economical than, for example, commercial photoresists, which are used in some prior methods.

BRIEF DESCRIPTION OF THE DRAWINGS

In the following, the embodiments and advantages of the invention are examined in greater detail with reference to the accompanying drawings.

EMBODIMENTS OF THE INVENTION

Definitions

Figure 1:
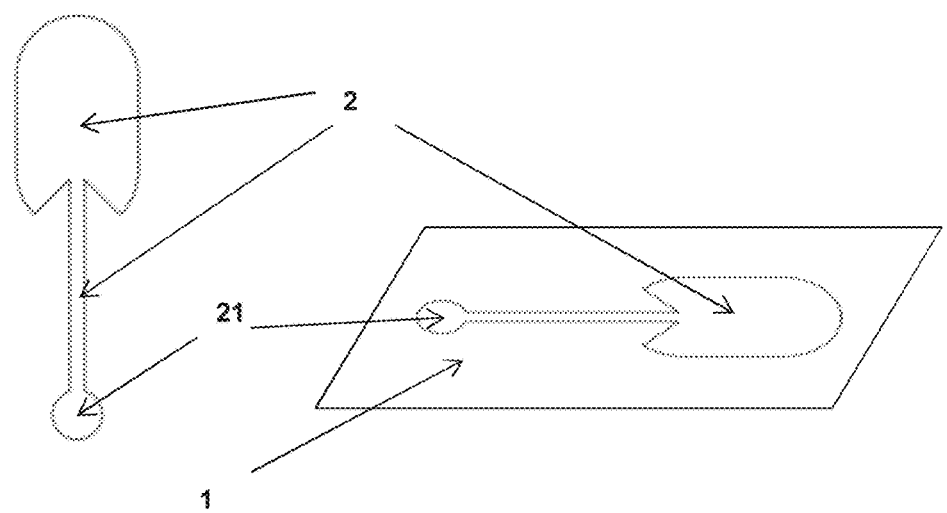
FIGS. 1 to 3 are drawing of the final structure according to some embodiments of the invention.

In the present context, the term "dispersion" is intended to cover all forms of aqueous mixtures, where the contents of the mixture are either dissolved or merely dispersed into the aqueous solution.

The term "porous" is intended to define the structure of the substrate. Such a porous substrate typically has a pore size of 2-25 µm, preferably 10-25 µm, most suitably about 20 µm, with the typical range of variation for such pore sizes. Suitable examples of porous hydrophilic substrates for the purposes of the present invention are cellulose-based papers, such as chromatography papers designed for this purpose. For example filter papers are typically prepared with the particularly preferred pore sizes.

The present invention relates to a method for manufacturing structural layers guiding liquid flow on such a porous substrate, wherein the structural layers are formed by flexographic or gravure printing, or screen printing, using as a printing solution a polymer dispersion based on poly(lactic acid), i.e. PLA. This poly(lactic acid) dispersion is hydrophobic, and, upon printing onto the porous substrate sheet, alters the properties of the substrate in such a way that liquid flow is prevented in the printed areas. Typically, the used printing solution is formed of either an aqueous polymer dispersion of D,L-lactic acid or an aqueous polymer dispersion of poly(lactic acid)-itaconic acid copolymer.

The printed areas are preferably shaped to leave spots or channels of unprinted substrate, depending on the intended application of the final product.

The dispersions based on hydrophobic polymeric materials of the invention typically contain suitably sized polymer particles that are capable of penetrating into the pores of the substrate. A narrow size distribution of particles also provides the dispersion with better stability.

In the present invention, aqueous dispersions of copolymers containing poly(lactic acid) (PLA) are used. As stated above, the lactic acid monomer forming the polylactide is typically D,L-lactic acid. This will give the dispersions a good biodegradability, and the polymerization of D,L-lactic acid has the advantage of being possible to control.

Poly(lactic acid) (PLA) dispersions in water are normally not stabile. However, by forming copolymers (PLAX) with suitable monomers, this problem has been overcome. These PLAX copolymers are typically such unsaturated copolymers of lactic acid, which can be thermally cured.

The polymer based on lactic acid monomer is typically mixed with water to produce a dispersion with a bio-based content of 60-80% by weight, calculated from the solids of the final dispersion. Such a content will provide the final product with a sufficiently high level of biodegradability, due to the poly(lactic acid) being a biopolymer.

The other monomers are typically present in a total content of 10-40% by weight, calculated from the solids of the dispersion. These other monomers of the copolymer of the invention preferably include itaconic acid, which is suitable for polymerization with the lactic acid monomer.

According to a preferred embodiment of the invention, the copolymer is formed of poly(lactic acid) and itaconic acid, which optionally is selected from the crosslinkable types.

The copolymers are typically prepared in presence of 1,4-cyclohexadimethanol or cis-2-butene-1,4-diol, these two alternatives having been found suitable for achieving, among others, a suitable degree of polymerization, and thus controlling the molecular weight of the final copolymer (PLAX).

Suitable molecular weights of the final copolymer (PLAX) are within the Mw range of 2000-3500 g/mol.

The solids contents of the dispersion are typically within the range of 30-60% by weight, although a solids content of 30-40% by weight is preferred, and is low enough to no longer require dilution.

Typically, the dispersion also includes a dispersing aid, preferred alternatives being poly(vinyl alcohol) (PVA), and in some cases a plasticizer such as acetylated mono- and diglycerides (Acetem) or acetyl tributyl citrate (ATBC). The plasticizers are used, among others, to obtain stable dispersions with sufficiently small polymer particles, and helps in transferring the polymer into the aqueous phase.

These dispersion aids and plasticizers are typically present in total contents of 10-25% by weight of the dispersed polymer, preferably in contents of 10-15% by weight of the dispersed polymer. Preferably at least a main portion of the dispersion aids (or plasticizers) is poly(vinyl alcohol) (PVA), such as about 10% by weight of the dispersed polymer.

When preparing the copolymer for the dispersion, the choice of monomers, as well as the choice of their contents, is used to control the molecular weight of the copolymer, as well as its degree of polymerization. For example, D,L-lactic acid gives a smaller degree of polymerization than other forms of lactic acid. Likewise, cis-2-butene-1,4-diol gives a higher degree of crosslinking than 1,4-cyclohexadimethanol.

In such a manner also the particle size of the copolymer is determined. A preferred particle size is slightly below the pore size of the substrate, particularly being 5-15 µm.

Using the above described monomers and their contents, only a short oven treatment is required to cause curing of the polymer, with a defined particle size.

The properties of the polymer(s) used in the hydrophobic dispersions of the invention, such as the glass transition temperature (Tg), have an effect on how the dispersion behaves in printing, such as in flexographic printing, where high shear forces can cause polymer agglomeration. Unsuitable properties can also lead the polymer to form a sticky layer on the printing plate, thus causing damage to the substrate structure.

Preferred Tg values of the copolymer are within the range of −15-30° C., most suitably within the range of 10–30° C.

The above described copolymer dispersion is used in the method of the invention to cover specific areas of the substrate, thus preventing liquid flow in these covered areas. Due to the penetration of the copolymer dispersion into the substrate following printing, the liquid flow is prevented also in the depth direction of the substrate.

The printing process is either flexographic or gravure printing, or screen printing, preferably being flexographic printing.

Several layers of printing solution can be printed on top of each other, to obtain a more complete coverage over the entire thickness of the substrate.

Figure 2:
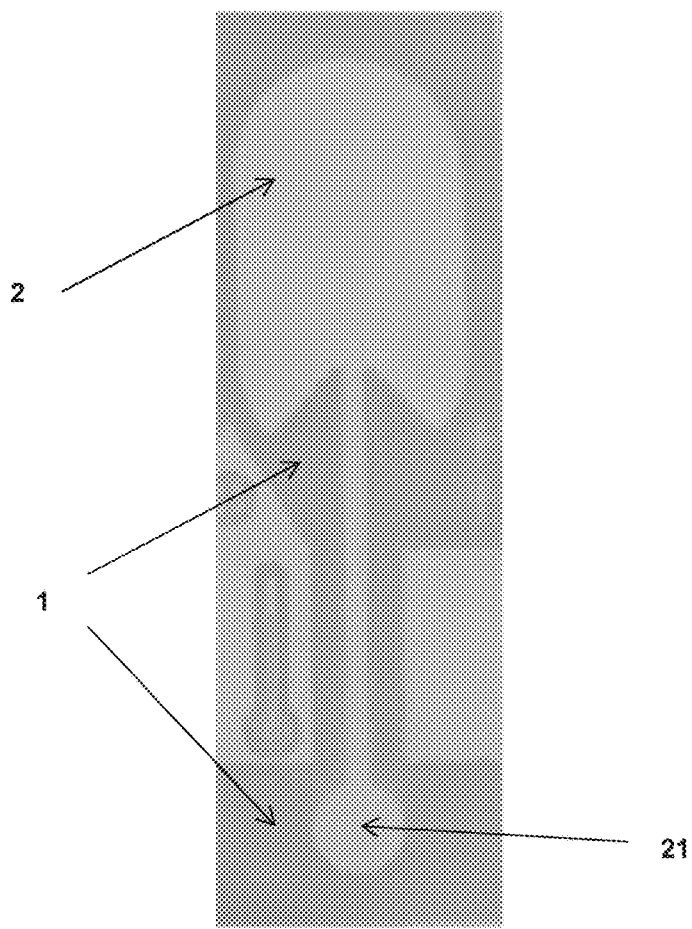

FIG. 1 is a schematic drawing of the structure according to one of the embodiments of the invention, whereas FIG. 2 illustrates the final structure more precisely. The structure according to this embodiment is prepared using the method where structural areas 1 are printed onto a substrate sheet, leaving unprinted adsorption areas 2, due to the effect of which liquid can travel in the substrate sheet only along the unprinted areas 2. A sample can be applied to a sample area 21, from which it can be led along a channel of unprinted substrate towards a substrate area 2. Preferably, the printed layers of the structural areas 1 are made thick enough to penetrate sufficiently far into the substrate to extend through the entire thickness or depth of the substrate sheet. Typically, the printed areas 1 are hydrophobic, while the unprinted areas 2 are hydrophilic.

Figure 3:
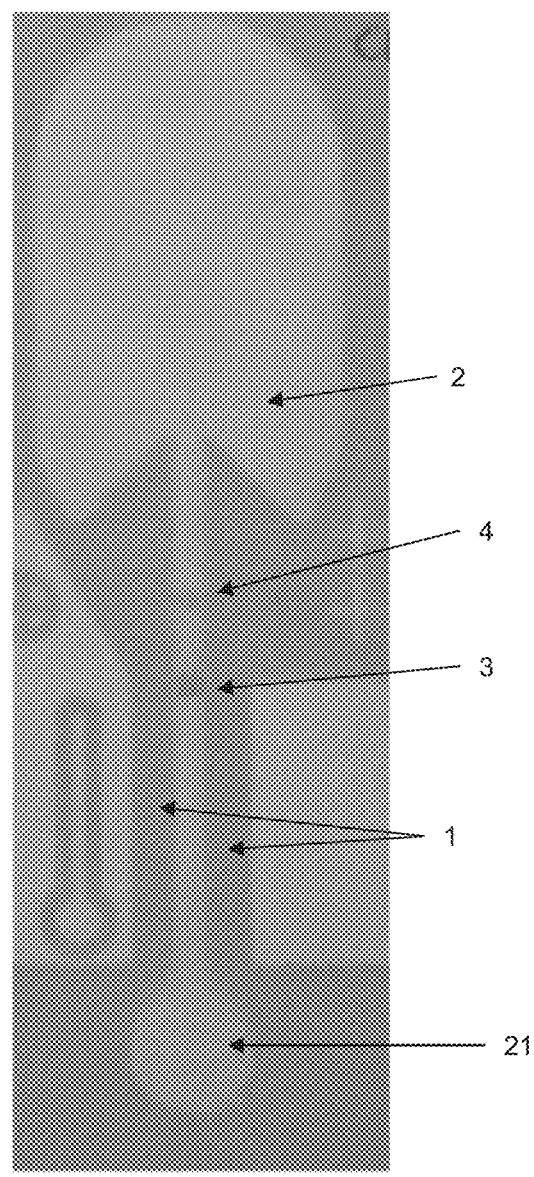

FIG. 3 is a similar structure, showing also a test line 3 and a control line 4, which can be utilized in sample testing.

Figure 4A:
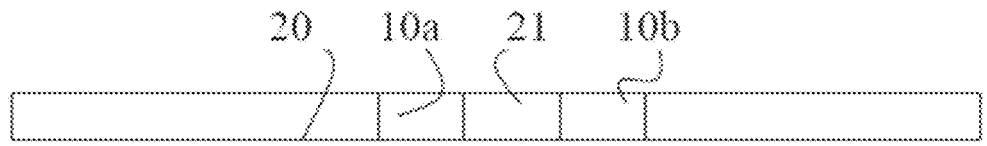
FIGS. 4A and 4B show schematic side cross-sections of structures according to two different embodiments of the invention.

FIG. 4A shows schematically the structure according to an embodiment of the invention. In this embodiment, a first printed area 10a and a second printed area 10b are printed on the substrate 20, between which remains an unprinted area 2, which is suitable for use, e.g. as a sample zone 21. Liquid brought to the sample zone 21 will remain in the zone in question, due to the barriers provided by the printed areas 10a,10b.

According to a further embodiment of the invention, liquid flow in the substrate is further blocked in the thickness direction by applying a separate printed layer 11 on the rear side (second surface) of the substrate 20, typically as a unified layer, thus preventing leaking of the sample solutions through the substrate 20. Such an alternative is particularly advantageous if the substrate is so thick that a printing solution applied on the front side (first surface) of the substrate is not capable of penetrating the substrate over its entire thickness.

The above described unified layer of printing solution printed on the rear side has the advantage that it simultaneously acts as a protective layer, which prevents the liquid from escaping through the rear side of the substrate. Thus, areas, such as liquid-guiding channels, with precise boundaries can be obtained when the separate layers of printing solution printed onto the front side and the rear side of the substrate meet.

Figure 4B:
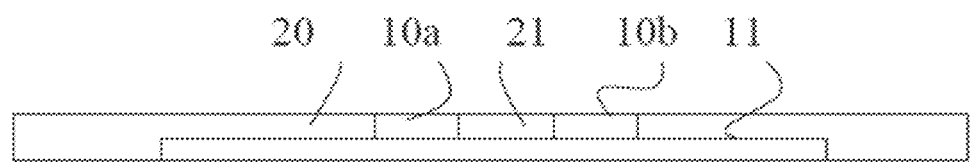

Such a structure, according to said further embodiment of the invention, is shown in FIG. 4B, having a unified or local layer 11 printed on the rear surface of the substrate 20. This rear layer 11 typically extends over the entire width of the sample zone 21 and prevents the sample liquid from coming through the substrate 20 in its thickness direction. Thus, the rear layer 11 forms a depth-direction barrier in the structure, in addition to the lateral barrier formed by the print zones 10a, 10b.

As the lateral liquid guiding effect improves, also the need for high sample volumes decreases. Further, the movement of foreign substances into the sample zone from the base of the substrate (e.g., a table top) is also effectively prevented.

According to a preferred embodiment, openings are left in the barrier layer 11 printed on the rear surface of the substrate, for feeding sample to the sample zone 21 and/or removing it from it, and feeding it for example to a second substrate placed beneath the first substrate, in direct contact with it.

After printing, the structures can also be heat treated, thus aiming for curing throughout the entire thickness of the structure, thus achieving a continuous and liquid-proof barrier inside the paper structure.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. In addition, various embodiments and examples of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In this description, numerous specific details are given to provide a thorough understanding of embodiments of the invention. One skilled in the relevant art will recognize, however, that the invention can be practiced without one or more of the specific details.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The following non-limiting examples are intended merely to illustrate the advantages obtained with the embodiments of the present invention.

EXAMPLES

Example 1—Dispersions of Poly(Lactic Acid) Copolymers (PLAX)

When preparing PLAX copolymer dispersions, D,L-lactic acid was polymerized with itaconic acid and a further co-initiator selected from 1,4-cyclohexadimethanol and cis-2-butene-1,4-diol. The exact compositions are shown in the below Table 1, with further details and properties of the compositions given in Table 2.

TABLE 1

Composition used to prepare PLAX copolymer.

| | Composition feed as mol-% from D,L-lactic acid | | |
|---|---|---|---|
| Sample code | Itaconic acid | 1,4-cyclohexadimethanol | cis-2-butene-1,4-diol |
| PLAX-PM1 | 10 | 10 | — |
| PLAX-PM2 | 20 | — | 20 |
| PLAX-PM3 | 5 | 5 | — |

TABLE 2

Properties of the PLAX copolymers having the compositions of Table 1.

| Sample code | GPC (CHCl₃) | | | DSC (2nd heating) | Solubility tests | |
| --- | --- | --- | --- | --- | --- | --- |
| | Mn | Mw | PDI | Tg (° C.) | THF | CHCl₃ |
| PLAX-PM1 | 1800 | 2650 | 1.43 | 11.4 | + | + |
| PLAX-PM2 | 1700 | 2240 | 1.31 | −13.7 | + | + |
| PLAX-PM3 | 1870 | 3020 | 1.61 | 25.0 | + | + |

Based on the molecular weights and glass transition temperatures, 1,4-cyclohexadimethanol was the more promising choice of further co-initiator, although both used alternatives were suitable.

The copolymers of the above Tables 1 and 2, i.e. PLAX copolymers PM1, PM2, and PM3, were added to aqueous dispersions, where also dispersion aid (stabilizer) with or without plasticizer was added. The contents of these dispersions are shown in the below Table 3.

TABLE 3

Aqueous dispersions of PLAX copolymers.

| Dispersion code | Polymer | Stabilizer/plasticizer, % | | | Solids content, wt-% | Observations |
| --- | --- | --- | --- | --- | --- | --- |
| | | PVA | Acetem | ATBC | | |
| D1-PM2 | PLAX-PM2 | 10 | — | — | 53.33 | Sticky |
| D2-PM1 | PLAX-PM1 | 10 | — | — | 48.03 | Big particles |
| D3-PM1 | PLAX-PM1 | 10 | 10 | — | 54.46 | Too soft |
| D4-PM1 | PLAX-PM1 | 20 | — | — | 34.00 | Not stable |
| D5-PM1 | PLAX-PM1 | 20 | 5 | — | 51.39 | Not stable |
| D6-PM1 | PLAX-PM1 | 10 | — | 5 | 56.10 | Stable |
| D7-PM1 | PLAX-PM1 | 10 | 5 | — | 53.40 | Stable |
| D8-PM1 | PLAX-PM1 | 10 | — | 3 | 49.31 | Stable |
| D9-PM3 | PLAX-PM3 | 10 | — | 3 | 36.15 | Stable |

The conclusion from these dispersion tests were that all prepared PLAX polymers and all prepared dispersions were suitable for use in the present invention. However, the best results were obtained when:
- combining PVA with a plasticizer,
- using ATBC as plasticizer,
- using 10% PVA,
- using lower contents of the second plasticizer (5% Acetem or 3% ATBC), or
- using PM3 as the PLAX copolymer.

Most likely, these results were linked at least partially to the solids contents of the dispersions.

Example 2—Biodegradability Studies of the PLAX Dispersions on Paper Substrates

Biodegradability tests were performed at 58° C. in aerobic aquatic conditions for the samples of Example 1. The biodegradability was calculated based on carbon dioxide evolution. The relative biodegradability was calculated as the ratio of maximum biodegradability of sample and starch used as reference. After 48 days the biodegradability of PLAX dispersion sample was 49% and the relative biodegradability was 72%.

Biodegradability of commercial PLA was tested for comparison and it degraded at slower rate than PLAX dispersion sample. After 48 days biodegradability of commercial PLA was 19% and the relative biodegradability was 28%. After 88 days the biodegradability and relative biodegradability of PLAX dispersion sample remain unchanged. In case of commercial PLA, after 88 days, the biodegradability was 41% and the relative biodegradability was 61%.

Tests performed in compost conditions, at 58° C. for 1 month, already showed complete degradation.

Example 3—CRP Testing on Paper Substrates

A printed structure according to FIG. 3 was prepared by flexographic printing.

A control antibody was added onto the control line by inkjet printing, which was anti-mouse IgG (H&L) goat antibody. The inkjet printed amount of antibody on the control line was 0.2 μg.

The test antibody was similarly inkjet printed onto the test line, which was anti-CRP antibody (6402, Medix Biochemica 5.2 mg/ml). The inkjet printed amount of anti-CRP-antibody was 0.26 μg.

Dilutions of a human serum sample with a known concentration CRP (CRP in human serum, ERM DA474/IFCC 41.2 mg/L) were then analyzed. Dilutions were made in PBS with 0.1% Tween-20. Blocking of the channel was carried out by dispensing 20 μl of PBS solution with 1% BSA on sample area and allowing liquid to flow through the channel.

After 10 min from dispensing blocking solution, 20 μl of diluted serum sample mixed with 1 μl of anti-CRP gold conjugate (gold nanoparticles diameter 40 nm mixed with anti-CRP antibody (6403, Medix Biochemica 4.8 mg/ml) was loaded on the sample area.

Figure 5:
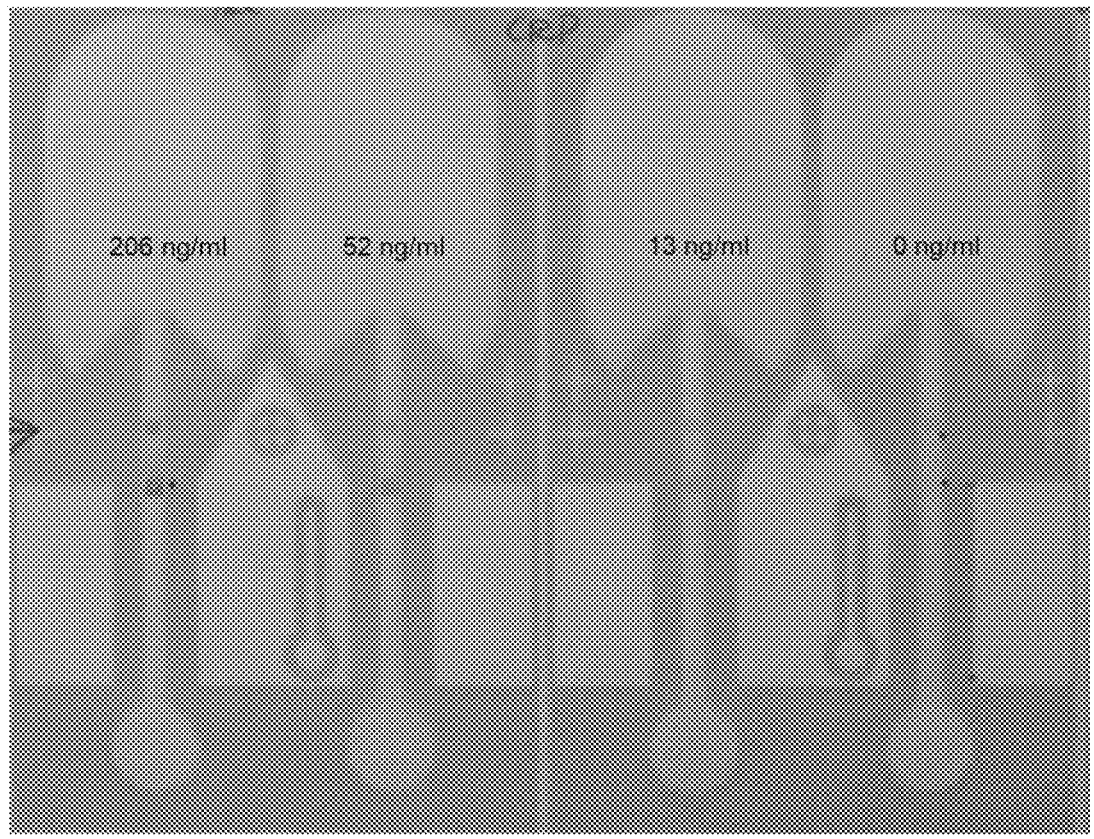
FIG. 5 shows the results of CRP tests with human serum samples, carried out on a structure according to the invention, with the intensity of the test line being dependent on the CRP concentration.

A picture of the final situation was taken an hour after sample dispensing (see FIG. 5). In FIG. 5, the intensity of the test line is dependent on the CRP concentration. The results indicated that channels as prepared using the technology of the present invention could be used as a platform for paper based diagnostics.

INDUSTRIAL APPLICABILITY

The present material can be used for micro-scale analysis of particularly aqueous liquids.

In particular, the material can be used in paper-based diagnostics, and generally for replacement of conventional synthetic polymers and wax materials used in printing hydrophobic areas on paper substrates.

REFERENCE SIGNS LIST

For FIGS. 1 to 4:
1 structural barrier area
  10a printed side structure
  10b printed side structure 11 printed rear layer
2 adsorption area
20 substrate
21 sample area
3 test line
4 control line

CITATION LIST

Patent Literature

KR 2016066891 A
US 20090298191 A1
US 20120198684 A1
WO 2017210606 A1

Non-Patent Literature

Olkkonen J., Lehtinen K., Erho T., Flexographically printed fluidic structures in paper. Anal. Chem. 2010, 82(24), 10246-50

The invention claimed is:

1. A method for manufacturing structural layers guiding a liquid flow on a porous substrate, wherein the structural layers are formed by printing onto at least one area of at least one surface of the porous substrate a printing solution comprising an aqueous polymer dispersion comprising D,L-lactic acid or an aqueous polymer dispersion of poly(lactic acid)—itaconic acid copolymer.

2. The method according to claim 1, wherein the porous substrate is a cellulose-based paper having a pore size of about 20 μm.

3. The method according to claim 1, wherein the printing solution is printed onto the porous substrate using flexographic printing, gravure printing, or screen printing.

4. The method according to claim 1, wherein the printing solution is printed on both sides of the porous substrate.

5. The method according to claim 1, wherein one or more patterned areas of printing solution are printed on a first side of the porous substrate.

6. The method according to claim 5, wherein structural layers forming at least two printed patterns are printed on the first side of the substrate sheet, at a distance from each other, in order to create a lateral flow channel between these patterns on said first side of the porous substrate.

7. The method according to claim 1, wherein one or more patterned or unified structural areas are printed on a second side of the porous substrate, and wherein the unified structural area covers essentially the entire second side of the substrate.

8. The method according to claim 1, wherein the polymer dispersion comprises polymer particles having a particle size of 5-15 μm comprising polymer(s) having a mean molecular mass of 2000-3500 g/mol.

9. The method according to claim 1, wherein the polymer dispersion is formed using D,L-lactic acid, in a content in dispersion of 60-80% by weight.

10. The method according to claim 1, wherein the polymer dispersion is prepared from a copolymer of D,L-lactic acid with an additional monomer and a co-initiator, and wherein the additional monomer and co-initiator are used in a total content of 10-40% by weight in the polymer dispersion.

11. The method according to claim 1, wherein the polymer dispersion is formed by preparing a copolymer of poly(lactic acid) and itaconic acid, which optionally is crosslinkable, in combination with one of 1,4-cyclohexadimethanol and cis-2-butene-1,4-diol.

12. The method according to claim 1, wherein the dispersion contains a dispersion aid selected from the group consisting of poly(vinyl alcohol) (PVA), acetylated mono- or diglycerides (Acetem), acetyl tributyl citrate (ATBC), and combinations thereof.

13. The method according to claim 1, wherein the dispersion further comprises a dispersion aid and a plasticizer in a total content of 10-25% by weight of the dispersion.

14. The method according to claim 1, wherein the dispersion has a solids content of 30-60% by weight.

15. The method according to claim 1, wherein Tg values of the polymer in the printing solution are within a range of −15-30° C.

16. The method according to claim 1, wherein a printed structure suitable for use in the analysis of liquid samples is formed, the printed structure comprising:
- a plurality of flow channels shaped with the aid of structural layers of printing solution,
- an application zone, shaped with the aid of structural layers of printing solution, and located at the intersection of the flow channels, and
- a detection or reaction area, shaped with the aid of structural layers of printing solution, and connected to each flow channel.

* * * * *